(12) United States Patent
Melvin, III et al.

(10) Patent No.: US 7,494,751 B2
(45) Date of Patent: Feb. 24, 2009

(54) METHOD AND APPARATUS FOR IMPROVING DEPTH OF FOCUS DURING OPTICAL LITHOGRAPHY

(75) Inventors: Lawrence S. Melvin, III, Hillsboro, OR (US); James P. Shiely, Aloha, OR (US)

(73) Assignee: Synopsys, Inc., Mountain View, CA (US)

( * ) Notice: Subject to any disclaimer, the term of this patent is extended or adjusted under 35 U.S.C. 154(b) by 856 days.

(21) Appl. No.: 11/045,966

(22) Filed: Jan. 27, 2005

(65) Prior Publication Data

US 2006/0166110 A1 Jul. 27, 2006

(51) Int. Cl.
*G03F 9/00* (2006.01)
(52) U.S. Cl. .................. 430/30; 430/5; 716/21
(58) Field of Classification Search .............. 430/5, 430/30; 716/21
See application file for complete search history.

(56) References Cited

U.S. PATENT DOCUMENTS 6,298,473 B1 * 10/2001 Ono et al. ............... 716/21

2007/0284727 A1 * 12/2007 Liao et al. ............... 257/700
2008/0131788 A1 * 6/2008 Vickery ............... 430/5
2008/0138588 A1 * 6/2008 Schroeder et al. ........ 428/195.1

* cited by examiner

Primary Examiner—Christopher G Young
(74) Attorney, Agent, or Firm—Park, Vaughan & Fleming LLP

(57) ABSTRACT

One embodiment of the present invention provides a system that improves the depth of focus during an optical lithography process. During operation, the system receives a mask layout. The system then selects an edge in the mask layout. Next, the system adds a notch to the edge to improve the depth of focus by helping to maintain a critical dimension associated with the edge as the optical lithography process drifts out of focus. Note that adding a notch to the edge adds a high spatial-frequency component to the mask layout. This high spatial-frequency component degrades as the optical lithography process drifts out of focus. This degradation causes the mask layout to allow more light into the pattern, which helps maintain the critical dimension, thereby improving depth of focus.

18 Claims, 6 Drawing Sheets

METHOD AND APPARATUS FOR IMPROVING DEPTH OF FOCUS DURING OPTICAL LITHOGRAPHY

BACKGROUND

1. Field of the Invention

The invention relates to the process of designing and fabricating semiconductor chips. More specifically, the invention relates to a method and an apparatus for improving depth of focus of a mask layout during optical lithography.

2. Related Art

Recent advances in integrated circuit technology have largely been accomplished by decreasing the feature size of circuit elements on a semiconductor chip. As the feature size of these circuit elements continues to decrease, circuit designers are being forced to rely on resolution enhancement techniques, such as assist features, to improve depth of focus during optical lithography.

Unfortunately, assist features cannot be used in certain situations. For example, certain illumination techniques, such as dipole illumination, impose strict restrictions on the pitch, which can make it impossible to find an appropriate location to place an assist feature. Similarly, it may not be possible to place assist features in fully nested line and space patterns.

Hence what is needed is a method and an apparatus to improve the depth of focus without the above mentioned problems.

SUMMARY

One embodiment of the present invention provides a system that improves the depth of focus during an optical lithography process. During operation, the system receives a mask layout. The system then selects an edge in the mask layout. Next, the system adds a notch to the edge to improve the depth of focus by helping to maintain a critical dimension associated with the edge as the optical lithography process drifts out of focus. Note that adding a notch to the edge adds a high spatial-frequency component to the mask layout. This high spatial-frequency component degrades as the optical lithography process drifts out of focus. This degradation causes the mask layout to allow more light into the pattern, which helps maintain the critical dimension, thereby improving depth of focus.

In a variation on this embodiment, the edge is part of a one-dimensional feature.

In a variation on this embodiment, the system operates during an optical proximity correction process.

In a variation on this embodiment, the edge is within an area of the mask layout where an assist feature cannot be placed.

In a variation on this embodiment, the system adds the notch to the edge by first dissecting the edge into segments. Next, the system biases the segments by different amounts to add the notch to the edge.

In a variation on this embodiment, the system biases the segments by different amounts by: dividing the segments into a first segment-group and a second segment-group; shifting the segments in the first segment-group; freezing the position of the segments in the first segment-group; and shifting the segments in the second segment-group using an optical proximity correction process.

DETAILED DESCRIPTION

Integrated Circuit Design and Fabrication

Figure 1:
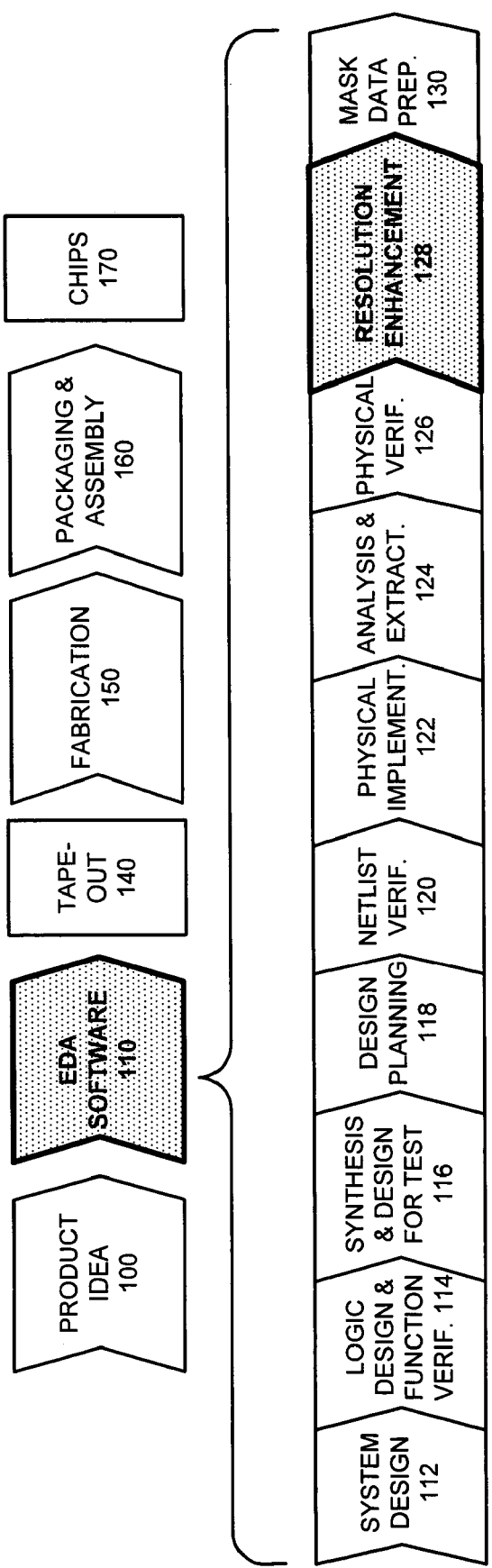
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention. The process starts with a product idea (step 100). Next, the product idea is realized using an integrated circuit, which is designed using Electronic Design Automation (EDA) software (step 110). Once the circuit design is finalized, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), resolution enhancement (step 128), and mask data preparation (step 130).

Techniques for improving the depth of focus can be used during the resolution enhancement step 128. Specifically, the Proteus® product from Synopsys, Inc. can use these techniques to improve the depth of focus.

Spatial Frequency and Depth of Focus

The present invention is based on finding the answer to the following question: why do serifs have a better depth of focus than hammerheads?

Serifs and hammerheads are line-end corrections that are often used in optical proximity correction. Experimental results have shown that serifs have better depth of focus than hammerheads. But, until now, the reasons for this difference in depth of focus have not been understood. To help understand these reasons, let us first examine the effect of defocusing on a hammerhead and a serif.

Figure 2A:
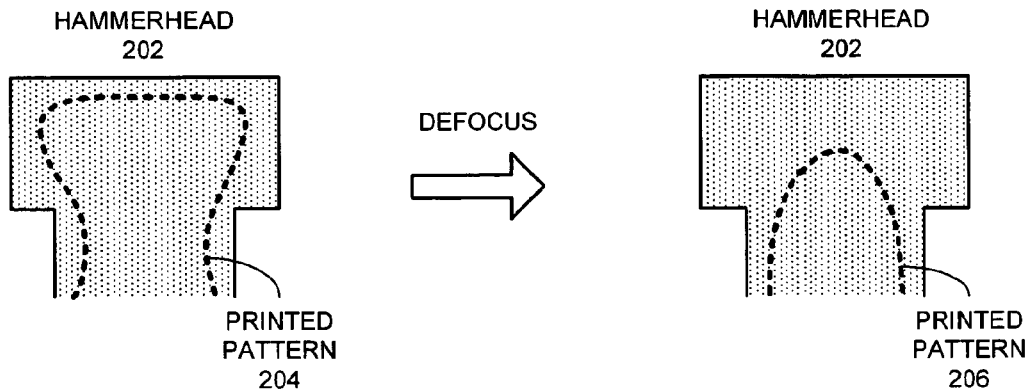
FIG. 2A illustrates the effect of defocusing on a hammerhead in accordance with an embodiment of the present invention.

FIG. 2A illustrates the effect of defocusing on a hammerhead in accordance with an embodiment of the present invention.

Hammerhead 202 creates printed pattern 204 when the optical lithography process is focused (on target). As optical lithography moves through defocus, the effective line end shrinks as illustrated by printed pattern 206.

Figure 2B:
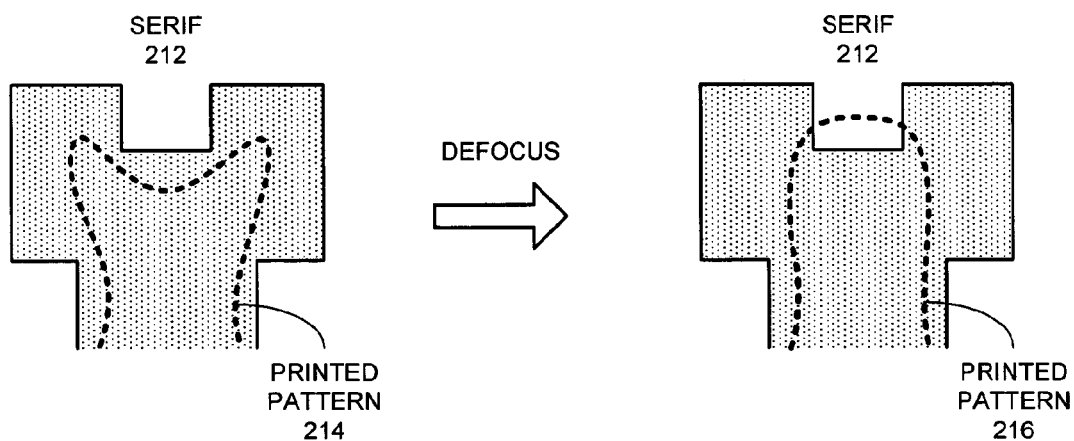
FIG. 2B illustrates the effect of defocusing on a serif in accordance with an embodiment of the present invention.

FIG. 2B illustrates the effect of defocusing on a serif in accordance with an embodiment of the present invention.

Serif 212 creates printed pattern 214 when the optical lithography process is on target. As optical lithography moves through defocus, the effective line end changes shape, but does not shrink significantly, as illustrated by printed pattern 216.

Figure 2C:
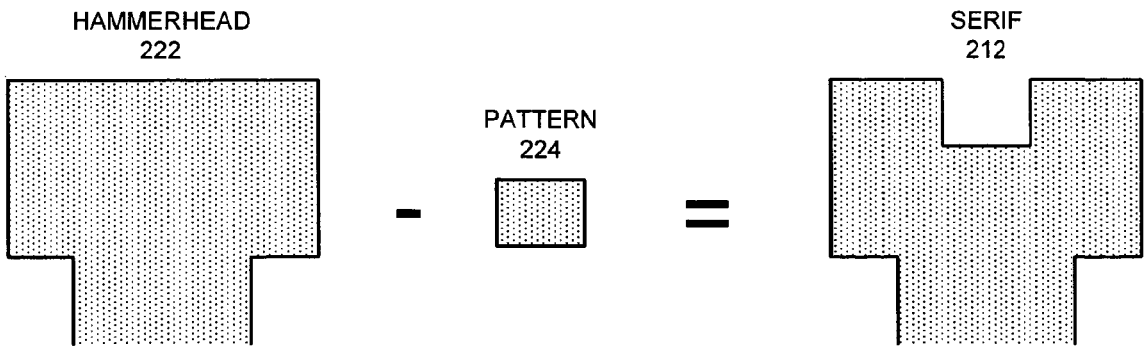
FIG. 2C illustrates why a serif has a better depth of focus than a hammerhead in accordance with an embodiment of the present invention.

FIG. 2C illustrates why a serif has a better depth of focus than a hammerhead in accordance with an embodiment of the present invention.

Note that pattern 304 can be viewed as the result of subtracting pattern 314 from pattern 312. (Note that, in one embodiment of the present invention, pattern 312 has a greater width than pattern 302.)

Based on the above mentioned reasons, it will be evident to one skilled in the art that the depth of focus for pattern 304 can be greater than the depth of focus for pattern 302. Specifically, as optical lithography moves through defocus, the loss of high frequency components of pattern 312 are compensated by the loss of high frequency components of pattern 314. As a result, the pullback for pattern 304 can be less than the pullback for pattern 302. In other words, the notches in pattern 304 can improve depth of focus.

Stated differently, adding a notch to an edge adds a high spatial-frequency component to the mask layout. As the optical lithography process drifts out of focus, the high spatial-frequency component degrades. This can cause the mask layout to allow more light into the pattern, which in turn, can help maintain the critical dimension. This is why adding one or more notches to an edge can improve depth of focus.

In one embodiment of the present invention, the system first tries to improve the depth of focus by placing an assist feature in the layout. If the system is unable to find a suitable location to place the assist feature, the system adds one or more notches to an edge to improve depth of focus.

Note that assist features have some drawbacks. For example, there are many situations where it is impossible to find a suitable location to place an assist feature. Specifically, certain illumination techniques, such as dipole illumination, impose strict restrictions on the pitch. This can make it impossible to find an appropriate location to place an assist feature. Similarly, it may not be possible to place assist features in fully nested line and space patterns.

The key to understanding why a serif has a better depth of focus than a hammerhead is to view serif 212 as the result of subtracting pattern 224 from hammerhead 222. (Note that, in one embodiment of the present invention, hammerhead 222 has a greater width than hammerhead 202).

Note that high frequency components of hammerheads 202 and 222 are lost during defocusing. Similarly, high frequency components of pattern 224 are also lost during defocusing.

Furthermore, note that a loss of high frequency components can cause the effective line end to shrink substantially. As a result, the effective line end for hammerhead 202 shrinks (as shown by printed pattern 206) due to the loss of high frequency components of hammerhead 202.

In contrast, as optical lithography moves through defocus, the loss of high frequency components of hammerhead 222 are compensated by the loss of high frequency components of pattern 224. As a result, the line end shrinkage is substantially reduced for serif 212. This is the reason why the notch in serif 212 improves depth of focus.

One embodiment of the present invention uses the above insight to improve the depth of focus of an edge of a one-dimensional feature in a mask layout.

Figure 3A:
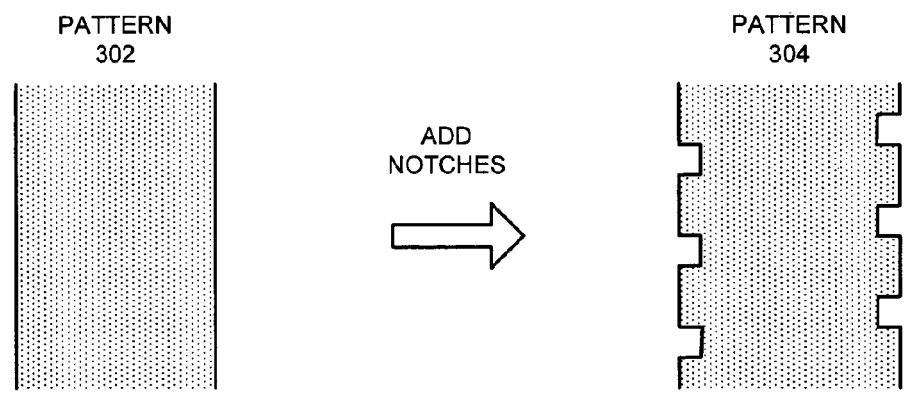
FIG. 3A illustrates how notches can be added to an edge to improve the depth of focus in accordance with an embodiment of the present invention.

FIG. 3A illustrates how notches can be added to an edge to improve the depth of focus in accordance with an embodiment of the present invention.

Pattern 302 is a portion of a line in a mask layout. Pattern 304 is obtained after adding notches to the edges of pattern 302.

Figure 3B:
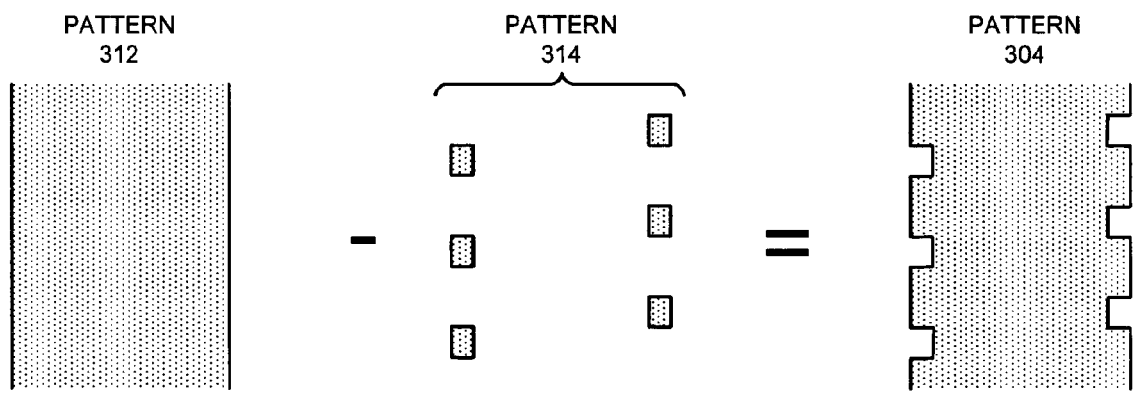
FIG. 3B illustrates why adding notches to an edge can improve the depth of focus in accordance with an embodiment of the present invention.

FIG. 3B illustrates why adding notches to an edge can improve the depth of focus in accordance with an embodiment of the present invention.

It will be apparent to one skilled in the art that the present invention does not have the above mentioned drawbacks. This is because the present invention simply involves adding one or more notches to an edge of an existing feature, which can usually be performed regardless of pitch restrictions. In contrast, placing an assist feature involves adding a new feature to the layout which may not be possible due to the above mentioned constraints.

Process of Improving Depth of Focus by Adding Notches to an Edge

Figure 4:
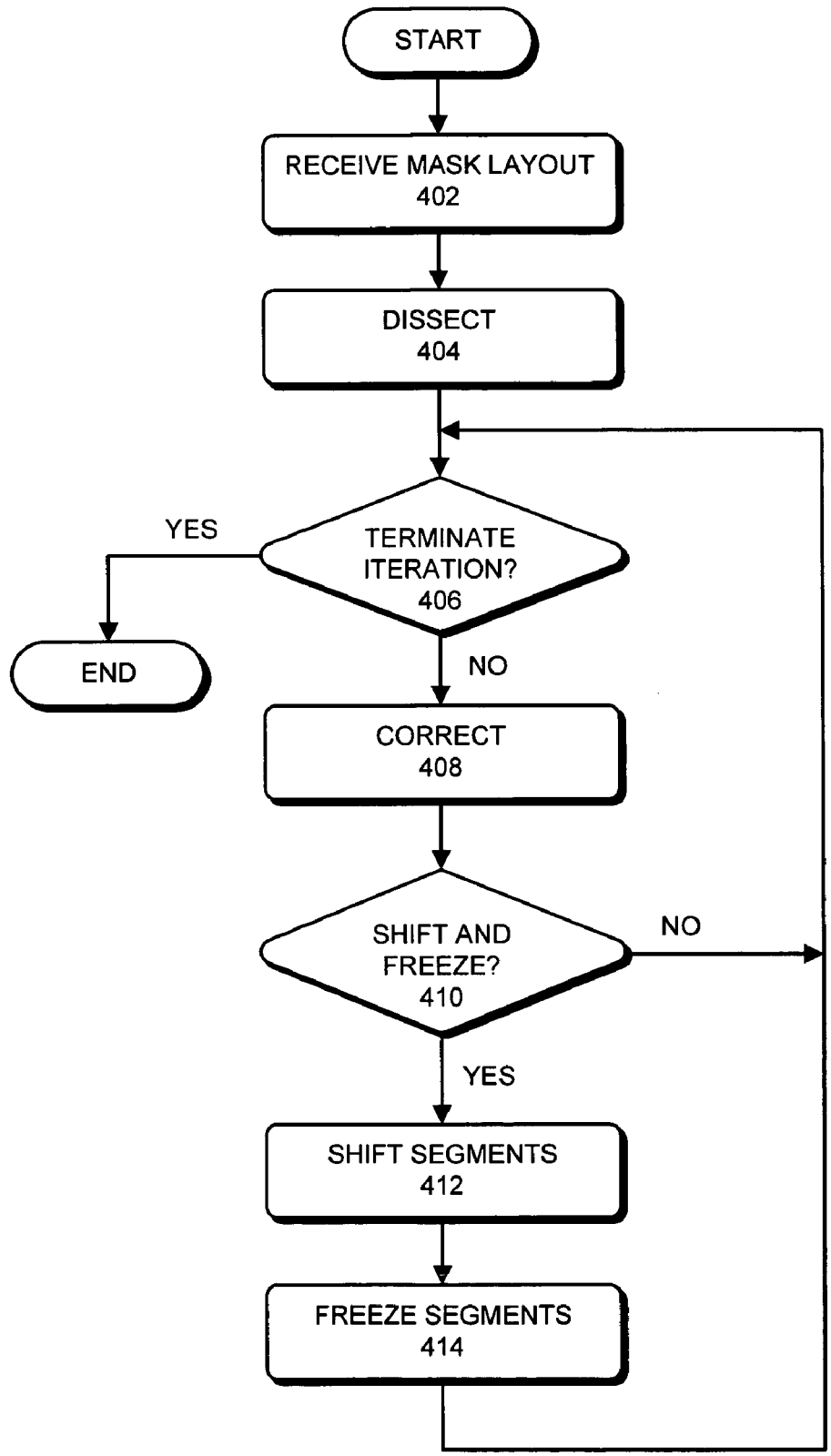
FIG. 4 presents a flowchart that illustrates the process of improving depth of focus by adding notches to an edge in accordance with an embodiment of the present invention.

FIG. 4 presents a flowchart that illustrates the process of improving depth of focus by adding notches to an edge in accordance with an embodiment of the present invention. Specifically, FIG. 4 presents a flowchart that illustrates how an optical proximity correction process can be extended to include a process for adding notches to an edge in accordance with an embodiment of the present invention.

The process begins by receiving a mask layout (step 402).

Next, the system dissects the layout into a number of segments (step 404). In one embodiment of the present invention, the system dissects the layout by dissecting each edge into one or more segments.

The system then determines whether the iterative optical proximity correction process should be terminated (step 406). (Recall that the flowchart presented in FIG. 4 illustrates an extension to an optical proximity correction process, which is typically performed in an iterative fashion.)

The process ends if the system decides that the iterative process should be terminated. On the other hand, if the system decides that the iterative process should be continued, it performs an optical correction on the mask layout (step 408).

Next, the system may add one or more notches to an edge by biasing the segments by different amounts. Specifically, in one embodiment of the present invention, the system determines whether to shift and freeze segments in the layout (step 410). Note that a variety of conditions may be used to determine whether to shift and freeze segments in the layout. Specifically, in one embodiment of the present invention, the system determines to shift and freeze segments after a predetermined number of iterations. For example, in one embodiment of the present invention, the system may determine to shift and freeze segments in the layout after exactly 6 iterations.

If the system determines not to shift and freeze segments in the layout, the process goes back to step 406 and may continue the iterative optical correction process.

Otherwise, if the system determines to shift and freeze segments in the layout, the system selects a set of segments and shifts them (step 412).

Next, the system freezes the current position of the shifted segments (step 414). This ensures that subsequent iterations of the optical proximity correction process do not move these frozen segments.

The system then goes back to step 406 and may continue the iterative optical correction process.

Figure 5:
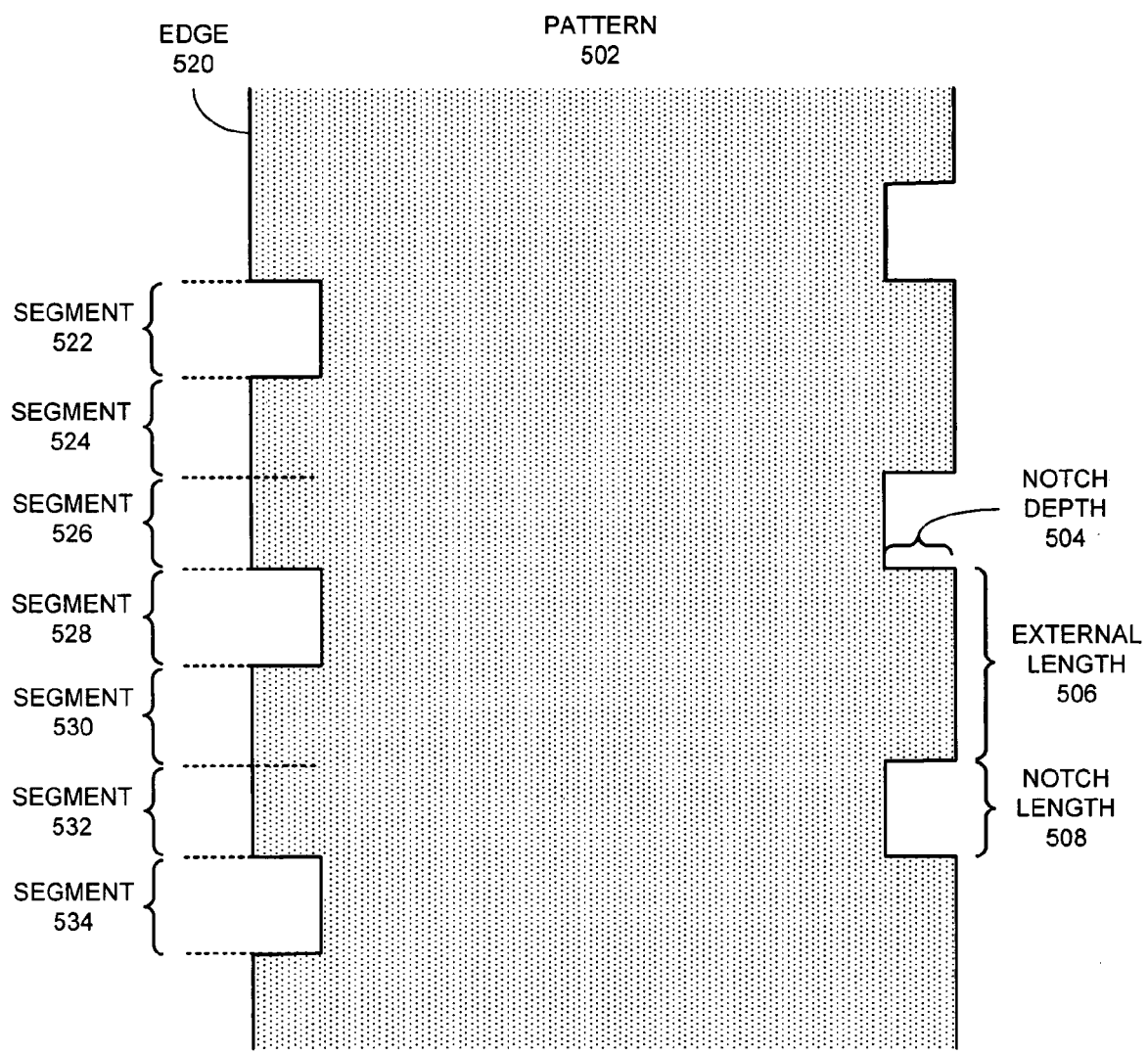
FIG. 5 illustrates various parameters related to the notch's shape that can be used to add notches to an edge in accordance with an embodiment of the present invention.

FIG. 5 illustrates various parameters related to the notch's shape that can be used to add notches to an edge in accordance with an embodiment of the present invention. In one embodiment of the present invention, these shape-related parameters are found empirically.

Pattern 502 contains a series of notches whose shape is based on various shape-related parameters, such as, the notch depth 504, external length 506, and notch length 508.

In one embodiment of the present invention, the system uses these shape-related parameters to determine how to divide the segments into different segment-groups and to determine how much to shift each segment-group. Furthermore, in one embodiment of the present invention, external length 506 and notch length 508 are based on the length of a segment.

Furthermore, in one embodiment of the present invention, the system divides the segments into a first segment-group and a second segment-group. Next, the system shifts and freezes the segments in the first segment-group. The system then shifts the segments in the second segment-group using an optical proximity correction process.

For example, the system can divide edge 520 into a number of segments, namely, segments 522, 524, 526, 528, 530, 532, and 534. Next, the system can create a first segment-group that includes segments 524, 526, 530, and 532. Additionally, the system can create a second segment-group that includes segments 522, 528, and 534.

The system can then shift the segments in the first segment-group. Note that the system can use the notch depth 504 to determine how much to shift the segments in the first segment-group. Next, the system can freeze the segments in the first segment-group. Finally, the system can iteratively adjust the position of the segments in the second segment-group using an optical proximity correction process. It will be apparent to one skilled in the art that the system can also divide the segments into more than two segment-groups and then shift and/or freeze the segments in one or more segment-groups.

Figure 6:
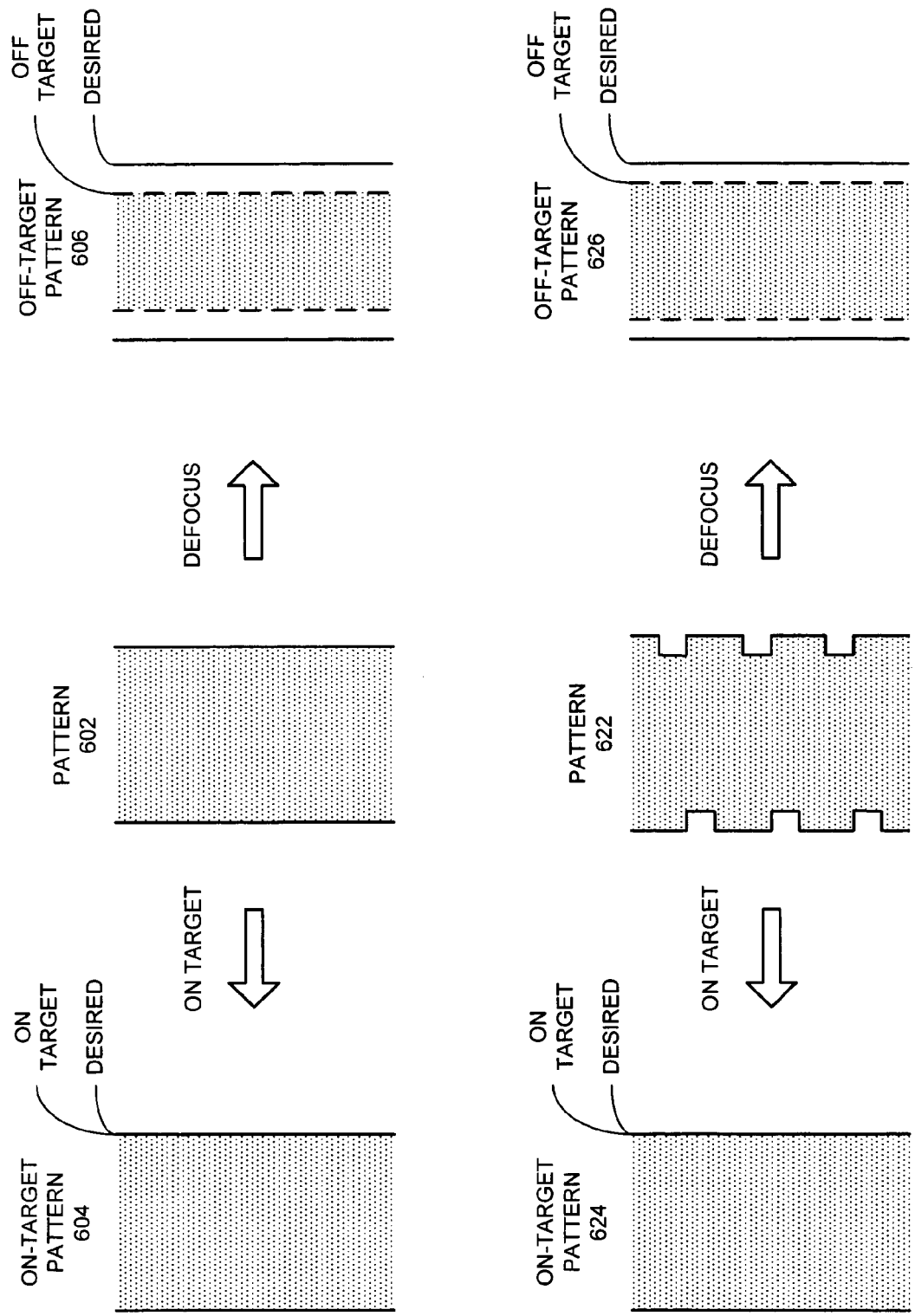
FIG. 6 illustrates an example in which the depth of focus improves when notches are added to an edge in accordance with an embodiment of the present invention.

FIG. 6 illustrates an improvement in depth of focus when notches are added to an edge in accordance with an embodiment of the present invention.

When optical lithography is on target, pattern 602 generates on-target pattern 604, which is very close to the desired pattern. On the other hand, when optical lithography is defocused, pattern 602 generates off-target pattern 606, which has a significant pullback.

Pattern 622 is obtained by adding notches to the edges of pattern 602. When optical lithography is on target, pattern 622 generates on-target pattern 624, which is very close to the desired pattern. On the other hand, when optical lithography is defocused, pattern 622 generates off-target pattern 626. Although off-target pattern 626 also has a pullback, it is less than the pullback in off-target pattern 606. Hence, this example illustrates how adding notches to the edges of pattern 602 can improve the depth of focus.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A method for improving the depth of focus for an edge during an optical lithography process, comprising:

receiving a mask layout;

selecting the edge in the mask layout, wherein the edge includes a first end and a second end, and wherein the edge comprises three non-overlapping regions: a first end-region which includes the first end, a second end-region which includes the second end, and a middle region which is located between the first end-region and the second end-region; and adding a notch to the middle region of the edge to improve the depth of focus for the edge, wherein adding the notch adds high spatial-frequency components to the edge which degrade as the optical lithography process drifts out of focus, thereby helping to maintain a critical dimension associated with the edge.

2. The method of claim 1, wherein the edge is part of a one-dimensional feature.

3. The method of claim 1, wherein the method is performed during an optical proximity correction process.

4. The method of claim 1, wherein the edge is within an area of the mask layout where an assist feature cannot be placed.

5. The method of claim 1, wherein adding the notch to the edge involves:

dissecting the edge into segments; and biasing the segments by different amounts to add the notch to the edge.

6. The method of claim 5, wherein biasing the segments by different amounts involves:

dividing the segments into a first segment-group and a second segment-group;

shifting the segments in the first segment-group;

freezing the position of the segments in the first segment-group; and shifting the segments in the second segment-group using an optical proximity correction process.

7. A computer-readable storage medium storing instructions that when executed by a computer cause the computer to perform a method for improving the depth of focus for an edge during an optical lithography process, the method comprising:

receiving a mask layout;

selecting the edge in the mask layout, wherein the edge includes a first end and a second end, and wherein the edge comprises three non-overlapping regions: a first end-region which includes the first end, a second end-region which includes the second end, and a middle region which is located between the first end-region and the second end-region; and adding a notch to the middle region of the edge to improve the depth of focus for the edge, wherein adding the notch adds high spatial-frequency components to the edge which degrade as the optical lithography process drifts out of focus, thereby helping to maintain a critical dimension associated with the edge.

8. The computer-readable storage medium of claim 7, wherein the edge is part of a one-dimensional feature.

9. The computer-readable storage medium of claim 7, wherein the method is performed during an optical proximity correction process.

10. The computer-readable storage medium of claim 7, wherein the edge is within an area of the mask layout where an assist feature cannot be placed.

11. The computer-readable storage medium of claim 1, wherein adding the notch to the edge involves:

dissecting the edge into segments; and biasing the segments by different amounts to add the notch to the edge.

12. The computer-readable storage medium of claim 11, wherein biasing the segments by different amounts involves:

dividing the segments into a first segment-group and a second segment-group;

shifting the segments in the first segment-group;

freezing the position of the segments in the first segment-group; and shifting the segments in the second segment-group using an optical proximity correction process.

13. An apparatus for improving the depth of focus for an edge during an optical lithography process, comprising:

a receiving mechanism configured to receive a mask layout;

a selecting mechanism configured to select the edge in the mask layout, wherein the edge includes a first end and a second end, and wherein the edge comprises three non-overlapping regions: a first end-region which includes the first end, a second end-region which includes the second end, and a middle region which is located between the first end-region and the second end-region; and a notch-adding mechanism configured to add a notch to the middle region of the edge to improve the depth of focus, wherein adding the notch adds high spatial-frequency components to the edge which degrade as the optical lithography process drifts out of focus, thereby helping to maintain a critical dimension associated with the edge.

14. The apparatus of claim 13, wherein the edge is part of a one-dimensional feature.

15. The apparatus of claim 13, wherein the apparatus operates during an optical proximity correction process.

16. The apparatus of claim 13, wherein the edge is within an area of the mask layout where an assist feature cannot be placed.

17. The apparatus of claim 13, wherein the notch-adding mechanism is configured to:

dissect the edge into segments; and bias the segments by different amounts to add the notch to the edge.

18. The apparatus of claim 13, wherein the notch-adding mechanism is configured to:

divide the segments into a first segment-group and a second segment-group;

shift the segments in the first segment-group;

freeze the position of the segments in the first segment-group; and shift the segments in the second segment-group using an optical proximity correction process.

* * * * *